United States Patent
Gao et al.

(10) Patent No.: US 12,167,558 B2
(45) Date of Patent: Dec. 10, 2024

(54) COVER PLATE FOR FOLDABLE DISPLAY MODULE, FOLDABLE DISPLAY MODULE AND DISPLAY DEVICE

(71) Applicant: BOE Technology Group Co., Ltd., Beijing (CN)

(72) Inventors: Biao Gao, Beijing (CN); Zhao Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/909,763

(22) PCT Filed: Nov. 17, 2021

(86) PCT No.: PCT/CN2021/131072
§ 371 (c)(1),
(2) Date: Sep. 29, 2022

(87) PCT Pub. No.: WO2022/199056
PCT Pub. Date: Sep. 29, 2022

(65) Prior Publication Data
US 2024/0215188 A1  Jun. 27, 2024

(30) Foreign Application Priority Data
Mar. 26, 2021 (CN) .......................... 202110326937.8

(51) Int. Cl.
*H05K 5/03* (2006.01)
(52) U.S. Cl.
CPC ..................................... *H05K 5/03* (2013.01)
(58) Field of Classification Search
None
See application file for complete search history.

(56) References Cited

U.S. PATENT DOCUMENTS 10,659,576 B1 * 5/2020 Hsu ....................... G06F 1/1624
10,839,722 B2 * 11/2020 Wang ...................... G09F 9/301
(Continued)

FOREIGN PATENT DOCUMENTS

| CN | 104977746 A | 10/2015 |
| CN | 110475452 A | 11/2019 |

(Continued)

OTHER PUBLICATIONS

International Search Report for PCT/CN2021/131072 Mailed Feb. 15, 2022.
(Continued)

*Primary Examiner* — Xanthia C Relford
*Assistant Examiner* — Xanthia C Cunningham
(74) *Attorney, Agent, or Firm* — Ling Wu; Stephen Yang; Ling and Yang Intellectual Property

(57) ABSTRACT

A cover plate for a foldable display module, a foldable display module and a display device are provided, the cover plate is disposed at a display side of a flexible display substrate, the foldable display module includes a bending region through which the foldable display module is folded and unfolded. The cover plate includes a first region corresponding to a position of the bending region and a second region positioned at two sides of the first region, and the cover plate further includes a first surface configured to face the flexible display substrate. The cover plate includes first and second side edges parallel to a first direction, the first direction is perpendicular to a bending axis of the foldable display module, and a portion of the second region close to the first side edge or/and the second side edge has a reinforcement strip which is disposed on the first surface.

14 Claims, 4 Drawing Sheets

(56) References Cited

U.S. PATENT DOCUMENTS

| | | | | |
|---|---|---|---|---|
| 2016/0187929 | A1* | 6/2016 | Kim | G06F 1/1643 |
| | | | | 345/184 |
| 2016/0374228 | A1* | 12/2016 | Park | G09F 9/301 |
| 2017/0023978 | A1* | 1/2017 | Cho | G06F 1/1652 |
| 2017/0060188 | A1* | 3/2017 | Han | G06F 1/1641 |
| 2017/0285691 | A1* | 10/2017 | Baek | G06F 1/1652 |
| 2018/0192527 | A1* | 7/2018 | Yun | G09F 9/301 |
| 2019/0131553 | A1* | 5/2019 | Park | G06F 1/1652 |
| 2019/0174645 | A1* | 6/2019 | Jeon | G06F 1/1681 |
| 2019/0334114 | A1* | 10/2019 | Park | H10K 77/111 |
| 2020/0137902 | A1* | 4/2020 | Park | H05K 5/0017 |
| 2020/0315015 | A1* | 10/2020 | Kim | H05K 1/189 |
| 2021/0150943 | A1 | 5/2021 | Cui et al. | |
| 2021/0333833 | A1 | 10/2021 | Chen | |

FOREIGN PATENT DOCUMENTS

| | | |
|---|---|---|
| CN | 110853514 A | 2/2020 |
| CN | 111146358 A | 5/2020 |
| CN | 111327735 A | 6/2020 |
| CN | 210722213 U | 6/2020 |
| CN | 210778608 U | 6/2020 |
| CN | 210955909 U | 7/2020 |
| CN | 111756889 A | 10/2020 |
| CN | 111768707 A | 10/2020 |
| CN | 112150928 A | 12/2020 |
| CN | 113066376 A | 7/2021 |
| JP | 2000-347212 A | 12/2000 |
| KR | 10-2020-0130901 A | 11/2020 |

OTHER PUBLICATIONS

Office Action dated Apr. 7, 2022 for Chinese Patent Application No. 202110326937.8 and English Translation.

Office Action dated Aug. 19, 2022 for Chinese Patent Application No. 202110326937.8 and English Translation.

Decision of Rejection dated Jan. 20, 2023 for Chinese Patent Application No. 202110326937.8 and English Translation.

* cited by examiner

US 12,167,558 B2

COVER PLATE FOR FOLDABLE DISPLAY MODULE, FOLDABLE DISPLAY MODULE AND DISPLAY DEVICE

CROSS-REFERENCE TO RELATED APPLICATIONS

The present application is a U.S. National Phase Entry of International Application PCT/CN2021/131072 having an international filing date of Nov. 17, 2021, which claims priority of Chinese Patent Application No. 202110326937.8, filed to the CNIPA on Mar. 26, 2021 and entitled "Cover Plate for Foldable Display Module, Foldable Display Module and Display Device", and the contents disclosed in the above-mentioned applications are hereby incorporated as a part of this application.

TECHNICAL FIELD

Embodiments of the present disclosure relate to, but are not limited to, the field of display technologies, and in particular to a cover plate for a foldable display module, a foldable display module and a display device.

BACKGROUND

With the development of flexible display panels, flexible display modules are more and more widely used. Due to flexible characteristics of flexible display modules, a foldable screen has become a mainstream of current designs and has great development space. In a folding process some foldable display modules, winkles will be formed in an edge region of a cover plate, which will cause poor appearance and affect normal use of products.

SUMMARY

The following is a summary of subject matter described herein in detail. The summary is not intended to limit the protection scope of claims.

An embodiment of the present disclosure provides a cover plate for a foldable display module, wherein the cover plate is disposed at a display side of a flexible display substrate of the foldable display module, the foldable display module includes a bending region through which the foldable display module is folded and unfolded; the cover plate includes a first region configured to be corresponding to a position of the bending region and a second region positioned at two sides of the first region, and the cover plate further includes a first surface configured to face the flexible display substrate; the cover plate includes a first side edge and a second side edge parallel to a first direction, wherein the first direction is a direction perpendicular to a bending axis of the foldable display module, and a portion of the second region close to the first side edge or/and the second side edge is provided with a reinforcement strip, and the reinforcement strip is disposed on the first surface of the cover plate.

An embodiment of the present disclosure further provides a foldable display module, including a flexible display substrate and a cover plate for a foldable display module according to any embodiment, wherein the cover plate is disposed at the display side of the flexible display substrate, the foldable display module includes a bending region through which the foldable display module is folded and unfolded; the flexible display substrate includes a first edge and a second edge parallel to the first direction, the cover plate includes a protrusion region protruding from the first edge or/and the second edge of the flexible display substrate, and the reinforcement strip is also disposed in the protrusion region.

An embodiment of the present disclosure further provides a display device which includes the foldable display module described in any of the aforementioned embodiments.

Other aspects may be understood upon reading and understanding the drawings and the detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with embodiments of the present disclosure, but do not form a limitation on the technical solutions of the present disclosure. Shapes and sizes of various components in the drawings do not reflect actual scales, and are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
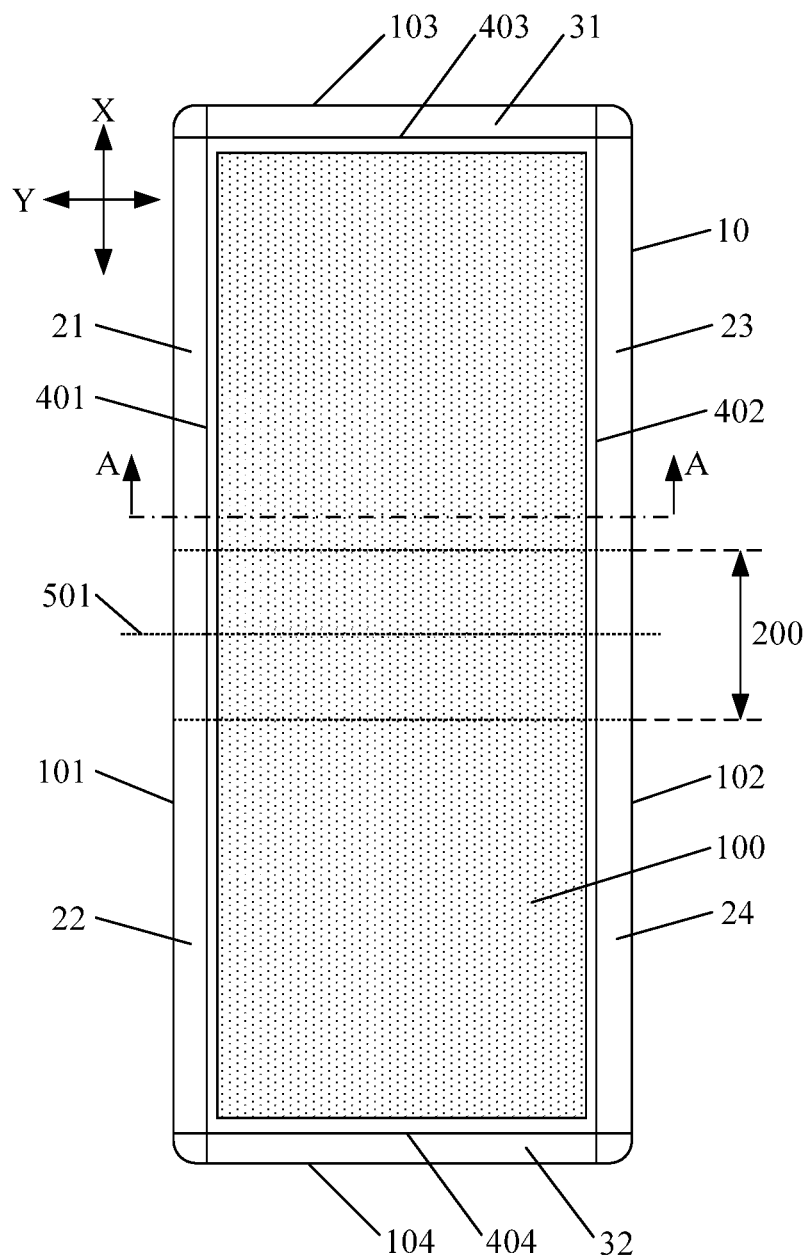
FIG. 1 is a schematic top view of a structure of a foldable display module according to some exemplary embodiments.
Figure 2:
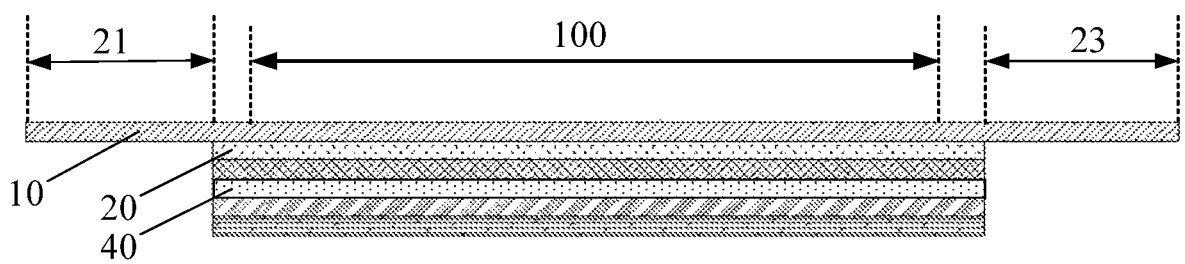
FIG. 2 is a schematic diagram of a cross-sectional structure taken along A-A of FIG. 1 in some techniques.

As shown in FIG. 1 and FIG. 2, FIG. 1 is a schematic top view of a structure of a foldable display module according to some exemplary embodiments. FIG. 2 is a schematic diagram of a cross-sectional structure taken along A-A of FIG. 1 in some techniques. The foldable display module includes a flexible display substrate 40 and a cover plate 10 disposed at a display side of the flexible display substrate 40. The foldable display module is folded (inward or outward) and unfolded by a bending region 200, a process of folding the foldable display module may be understood as a folding about a bending axis (imaginary axis) 501. In a direction parallel to the bending axis 501, the cover plate 10 is disposed protruding from the flexible display substrate 40 and a portion of the cover plate 10 protruding from the flexible display substrate 40 forms a protrusion region (in some examples, the protrusion region includes a first protrusion region 21 and a third protrusion region 23). In the folding process of the foldable display module, the entire cover plate 10 is bent with the bending of the foldable display module. After the foldable display module is folded (for example, by 180 degrees), the cover plate 10 will be subjected to a certain bending force, and wavy wrinkles will be formed in the protrusion region of the cover plate 10 due to internal stress (extrusion force), which results in poor appearance. Moreover, several times of folding may lead to a problem of adhesive failure of the optical clear adhesive 20 between the cover plate 10 and the flexible display substrate 40, which will affect the normal use of the product.

Figure 3:
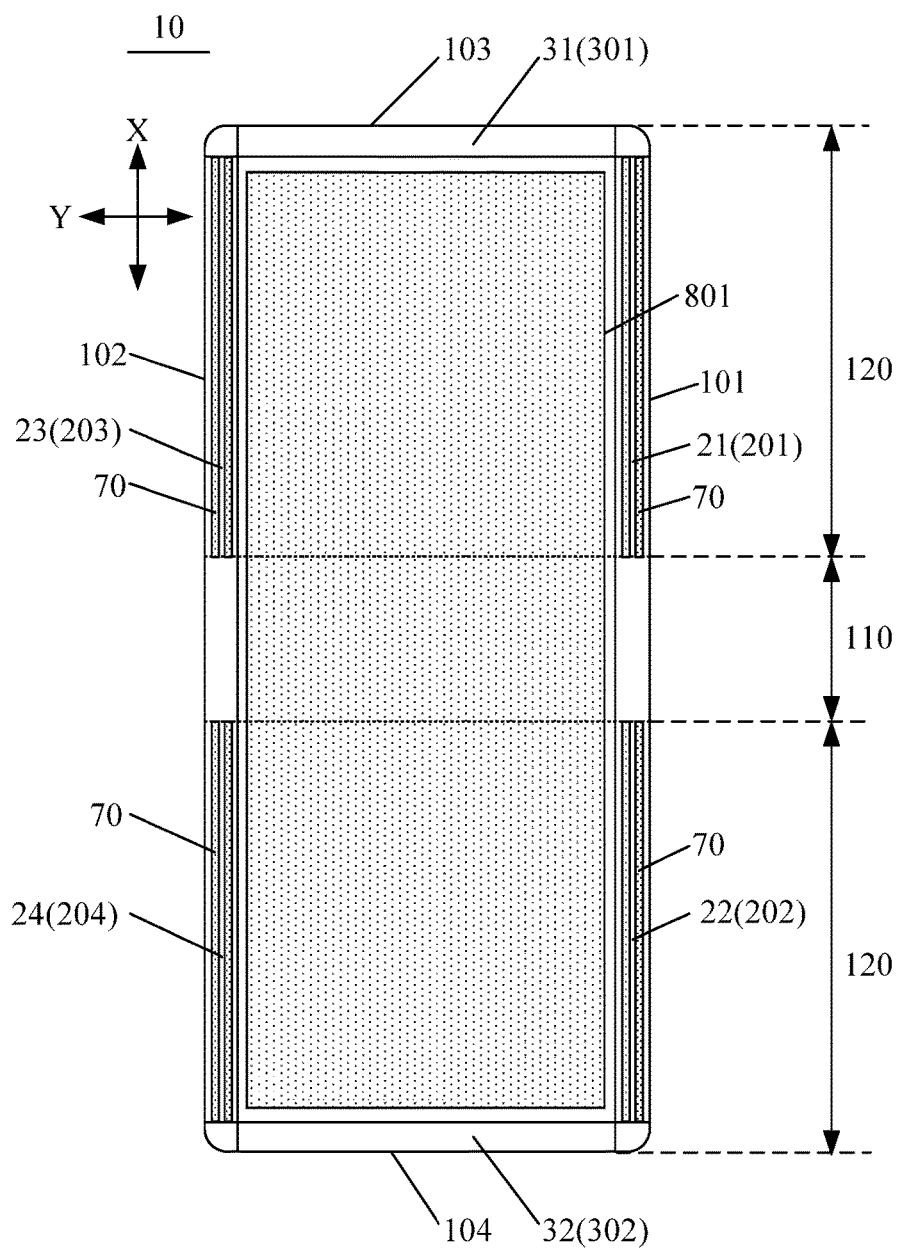
FIG. 3 is a schematic diagram of a planar structure of a cover plate for a foldable display module according to some exemplary embodiments.
Figure 4:
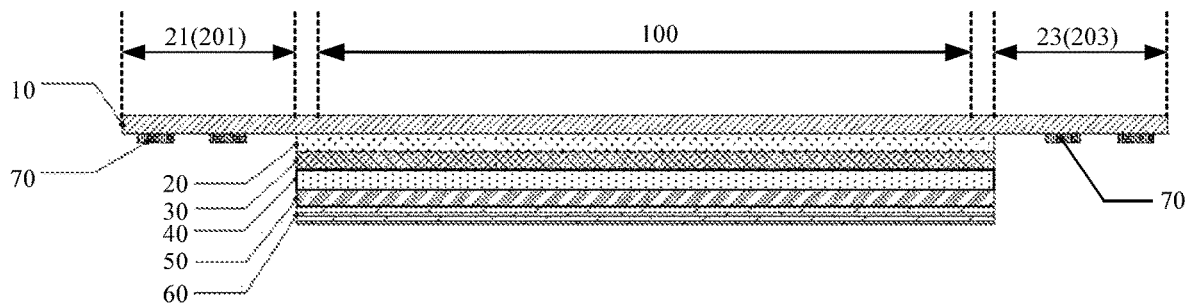
FIG. 4 is a schematic diagram of a cross-sectional structure taken along A-A of FIG. 1 in some exemplary embodiments.

An embodiment of the present disclosure provides a cover plate for a foldable display module. In some exemplary embodiments, as shown in FIG. 1, FIG. 3 and FIG. 4, FIG. 1 is a schematic top view of a structure of a foldable display module according to some exemplary embodiments. FIG. 3 is a schematic diagram of a planar structure of a cover plate for a foldable display module according to some exemplary embodiments. FIG. 4 is a schematic diagram of a cross-sectional structure taken along A-A of FIG. 1 in some exemplary embodiments. The cover plate 10 is disposed at a display side of the flexible display substrate 40 of the foldable display module. The foldable display module includes a bending region 200, and the foldable display module is folded and unfolded through the bending region 200. The cover plate 10 includes a first region 110 arranged corresponding to a position of the bending region 200, and a second region 120 located at two sides of the first region 110, and the cover plate 10 further includes a first surface configured to face the flexible display substrate 40. The cover plate 10 includes a first side edge 101 and a second side edge 102 which are parallel to the first direction, wherein the first direction (X direction in FIG. 1 and FIG. 3) is perpendicular to the bending axis 501 of the foldable display module. A portion of a second region 120 close to the first side edge 101 or/and the second side edge 102 is provided with a reinforcement strip 70, wherein the reinforcement strip 70 is disposed on the first surface of the cover plate 10.

In the cover plate for the foldable display module according to the embodiment of the present disclosure, the reinforcement strip 70 is disposed in a portion of the second region 120 close to the first side edge 101 or/and the second side edge 102, and the reinforcement strip 70 is disposed on the first surface of the cover plate 10 facing the flexible display substrate 40, therefore, the reinforcement strip 70 can improve a bending stiffness of the portion of the second region 120 close to the first side edge 101 or/and the second side edge 102. When the cover plate 10 according to the embodiment of the present disclosure is applied to a foldable display module, the first side edge 101 or/and the second side edge 102 of the cover plate 10 may be configured to protrude from the flexible display substrate 40. In the folding process of the foldable display module, deformation of the portion of the cover plate 10 close to the first side edge 101 or/and the second side edge 102 is small, and wrinkles will not be easily formed or can be reduced, such that poor appearance will not be easily caused and the normal use of the product is not affected.

In some exemplary embodiments, as shown in FIG. 3, the second region 120 includes a first frame region 201 and a second frame region 202 which are close to the first side edge 101, and a third frame region 203 and a fourth frame region 204 which are close to the second side edge 102. By way of example, the first frame region 201, the second frame region 202, the third frame region 203, and the fourth frame region 204 may each be provided with at least one reinforcement strip 70, which may keep the first frame region 201, the second frame region 202, the third frame region 203, and the fourth frame region 204 flat and reduce the formation of wrinkles after the foldable display module is folded. In the example of FIG. 3, the first frame region 201, the second frame region 202, the third frame region 203, and the fourth frame region 204 are each provided with two reinforcement strips 70, wherein the two reinforcement strips 70 both extend along the first direction and are arranged side by side.

In some exemplary embodiments, as shown in FIG. 3, the reinforcement strips 70 may extend along the first direction. By way of example, one end of a reinforcement strip 70 may extend to one end of the second region 120 close to the first region 110, and the other end of the reinforcement strip 70 may extend to one end of the second region 120 away from the first region 110.

Figure 5:
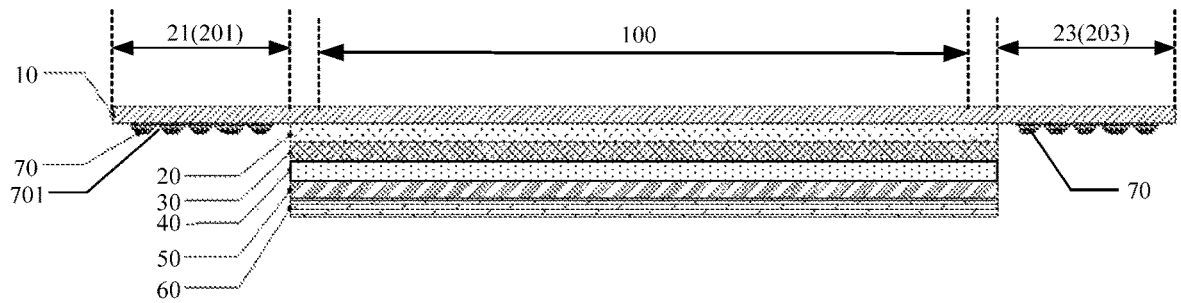
FIG. 5 is a schematic diagram of a cross-sectional structure taken along A-A of FIG. 1 in some other exemplary embodiments.
Figure 6:
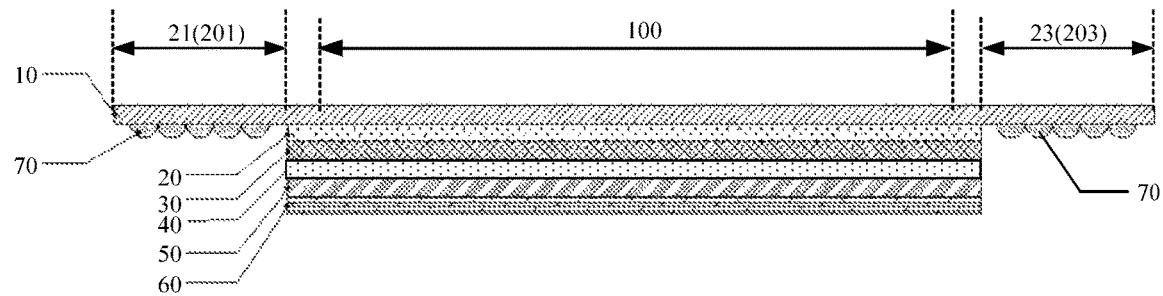
FIG. 6 is a schematic diagram of a cross-sectional structure taken along A-A of FIG. 1 in some further exemplary embodiments.

In some exemplary embodiments, a cross-section of the reinforcement strip 70 (cross-section along a direction parallel to the bending axis 501) is shaped to be rectangular, trapezoidal, triangular, or semicircular. By way of example, as shown in FIG. 4, FIG. 5 and FIG. 6, FIG. 4, FIG. 5 and FIG. 6 are schematic diagrams of the cross-sectional structure taken along A-A of FIG. 1 in different exemplary embodiments, in which the cross-sectional shape of the reinforcement strip 70 is rectangular in FIG. 4. As shown in FIG. 5, the cross-sectional shape of the reinforcement strip 70 is trapezoidal. As shown in FIG. 6, the cross-sectional shape of the reinforcement strip 70 is semicircular. The cross-sectional shape of the reinforcement strip 70 in the embodiments of the present disclosure is not limited.

In some exemplary embodiments, as shown in FIG. 3, a portion of the second region 120 close to the first side edge 101 or the second side edge 102 is provided with a plurality (two or more) of the reinforcement strips 70, wherein the plurality of reinforcement strips 70 are arranged side by side along the direction parallel to the bending axis 501 of the foldable display module (Y direction in FIG. 1 and FIG. 3), and two adjacent reinforcement strips 70 may be arranged at intervals or in close proximity. By way of example, as shown in FIG. 3, the first frame region 201, the second frame region 202, the third frame region 203, and the fourth frame region 204 are each provided with two reinforcement strips 70, wherein the two reinforcement strips 70 both each extend along the first direction and are arranged side by side along the direction parallel to the bending axis 501.

In some exemplary embodiments, as shown in FIG. 5, the portion of the second region 120 close to the first side edge or the second side edge may be provided with one reinforcement strip 70, wherein the reinforcement strip 70 may extend along the first direction, and a surface of the reinforcement strip 70 facing away from the cover plate 10 may be provided with at least one groove 701, and the at least one groove 701 extends along the first direction. A cross section (cross section along the direction parallel to the bending axis 501) of the groove 701 may be rectangular, trapezoidal, triangular, semicircular or the like. When a plurality of the grooves 701 are provided, cross-sectional shapes of the plurality of grooves 701 may be the same or different. By way of example, as shown in FIG. 5, the first frame region 201 and the third frame region 203 are each provided with one reinforcement strip 70, wherein the reinforcement strip 70 extends along the first direction, and a surface of the reinforcement strip 70 facing away from the cover plate 10 is provided with four grooves 701. The four grooves 701 are arranged at intervals along the direction parallel to the bending axis 501, each of the grooves 701 extends along the first direction, and each of the grooves 701 has a trapezoidal or triangular cross-sectional shape.

In some exemplary embodiments, an elastic modulus of the reinforcement strip 70 may be 4 GPa to 8 GPa.

In some exemplary embodiments, a material of the reinforcement strip may be a flexible material such as polyethylene terephthalate (PET), acrylic or polyimide, the reinforcement strip may be a strip made of these flexible materials, and the reinforcement strip may be bonded to the cover plate using an adhesive. Alternatively, the reinforcement strip may be formed by curing glue, which may be optical curable glue (such as ultraviolet curable glue) and the like. The glue may be coated on the cover plate and then cured to form the reinforcement strip. A material of the cover plate may be the same as or different from the material of the reinforcement strip, for example, the material of the cover plate may be polyimide.

In some exemplary embodiments, the cover plate may have a thickness of 50 μm to 100 μm and the reinforcement strip may have a thickness of 100 μm to 200 μm.

In some exemplary embodiments, as shown in FIG. 1 and FIG. 3, the cover plate 10 further includes a third side edge 103 and a fourth side edge 104 opposite to each other, wherein the third side edge 103 and the fourth side edge 104 are both parallel to the bending axis 501. The reinforcement strips are not disposed at the four corners of the cover plate 10, nor at portions of the cover plate 10 close to the third side 103 and the fourth side edge 104 (i.e., a fifth frame region 301 and a sixth frame region 302 shown in FIG. 3). The first region 110 is not provided with a reinforcement strip.

In some exemplary embodiments, the cover plate 10 may include a substrate of a transparent material and a light shielding layer disposed on a first surface of the substrate. The light shielding layer is provided with a hollow region corresponding to a position of the display region 100 (shown in FIG. 1) of the foldable display module, and the hollow region is a display window region 801 (shown in FIG. 3) of the cover plate 10 for viewing an image displayed in the display region 100 of the foldable display module.

The embodiment of the present disclosure further provides a foldable display module. In some exemplary embodiments, as shown in FIG. 1, FIG. 3 and FIG. 4, the foldable display module includes a flexible display substrate 40 and the cover plate 10 for the foldable display module described in any of the previous embodiments, wherein the cover plate 10 is disposed at a display side of the flexible display substrate 40, and the foldable display module includes a bending region 200, wherein the foldable display module is folded and unfolded through the bending region 200. The flexible display substrate 40 includes a first edge 401 and a second edge 402 parallel to the first direction, the cover plate 10 includes the protrusion region (in some examples, as shown in FIG. 3, the protrusion region includes the first protrusion region 21, the second protrusion region 22, the third protrusion region 23, and the fourth protrusion region 24 within the second region 120) that protrudes from the first side edge 401 or/and the second side edge 402 of the flexible display substrate 40, and the reinforcement strip 70 is further disposed in the protrusion region.

In the foldable display module according to the embodiment of the present disclosure, since the reinforcement strip 70 is provided at the portion of the second region 120 of the cover plate 10 close to the first side edge 101 or/and the second side edge 102, and the reinforcement strip 70 is located in the protrusion region of the cover plate 10, therefore, the reinforcement strip 70 can improve bending stiffness of the portion of the second region 120 of the cover plate 10 close to the first side edge 101 or/and the second side edge 102. In a folding process of the foldable display module, deformation of the portion of the cover plate 10 close to the first side edge 101 or/and the second side edge 102 is small, and wrinkles will not be easily formed or can be reduced, so that poor appearance will not be easily caused and normal use of the product is not affected.

In some exemplary embodiments, as shown in FIG. 1, the flexible display substrate 40 further includes a third edge 403 and a fourth edge 404 parallel to the bending axis 501, and the cover plate 10 further includes a third side edge 103 and a fourth side edge 104 opposite to each other. The third side edge 103 of the cover plate 10 may protrude from the third edge 403 of the flexible display substrate 40 or the third side edge 103 of the cover plate 10 may be flush with the third edge 403 of the flexible display substrate 40. The fourth side edge 104 of the cover plate 10 may protrude from the fourth edge 404 of the flexible display substrate 40 or the fourth side edge 104 of the cover plate 10 may be flush with the fourth edge 404 of the flexible display substrate 40. In the example of FIG. 1, the third side edge 103 of the cover plate 10 protrudes from the third edge 403 of the flexible display substrate 40 and the protruding portion of the cover plate 10 forms a fifth protrusion region 31. The fourth side edge 104 of the cover plate 10 protrudes from the fourth edge 404 of the flexible display substrate 40 and the protruding portion of the cover plate 10 forms a sixth protrusion region 32. None of the fifth protrusion region 31, the sixth protrusion region 32, and the four corner positions and the first region 110 of the cover plate 10 are not provided with a reinforcement strip.

In some exemplary embodiments, as shown in FIG. 4, the foldable display module may further include a polarizer 30 disposed between the cover plate 10 and the flexible display substrate 40, and a support layer 60 disposed at a side of the flexible display substrate 40 facing away from the cover plate 10. The cover plate 10 also protrudes from the polarizer 30 and the support layer 60 in a direction parallel to the bending axis 501 of the foldable display module. By way of example, optical clear adhesive bonding may be used between the cover plate 10 and the polarizer 30, and between the polarizer 30 and the flexible display substrate 40 (FIG. 4 shows the optical clear adhesive 20 between the cover plate 10 and the polarizer 30). At the display side, the cover plate 10 may protect a film layer of the foldable display module located below the cover plate 10. The polarizer 30 may have a function of anti-reflection. The display region 100 of the flexible display substrate 40 may have functions of display and touch-control. The support layer 60 may include a metal support, which may have good resilience, and provide support for the entire foldable display module, and may also function in improving creases of the flexible display module. A back film 50 may further be attached to the surface of the flexible display substrate 40 facing away from the cover plate 10, and the region of the back film 50 corresponding to the bending region 200 may be hollowed out, and the back film 50 may function in supporting and protecting the flexible display substrate 40.

Figure 7:
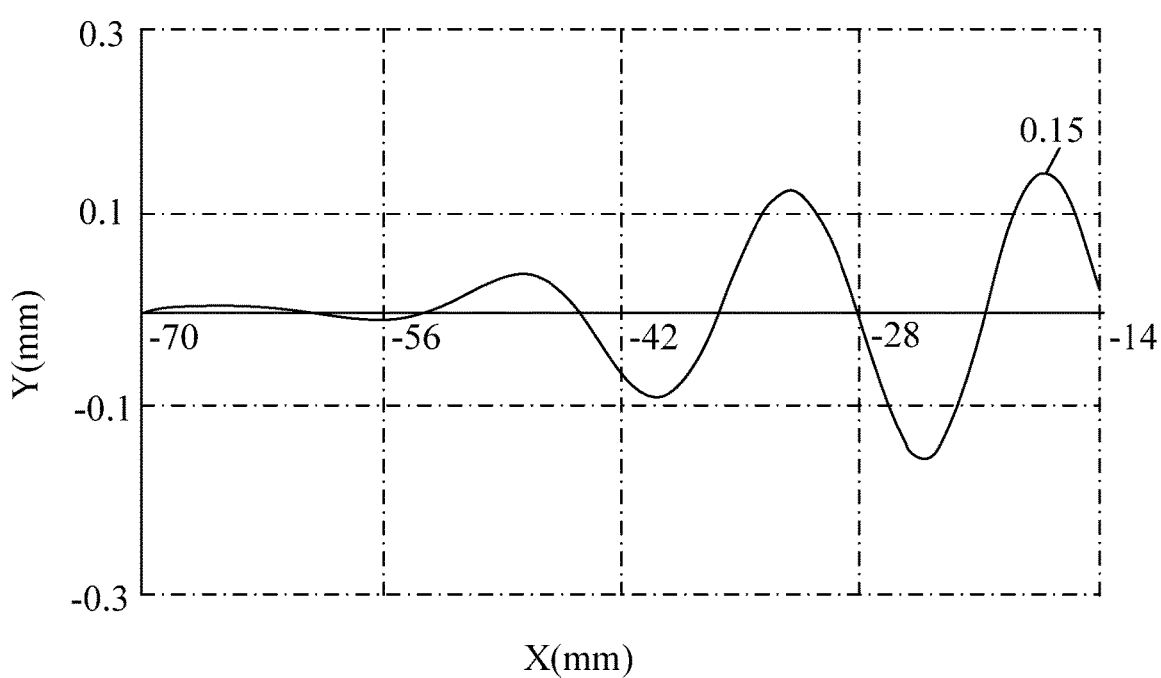
FIG. 7 is a curve graph of wrinkles formed in the third protrusion region of the cover plate after the foldable display module of FIG. 2 is folded.
Figure 8:
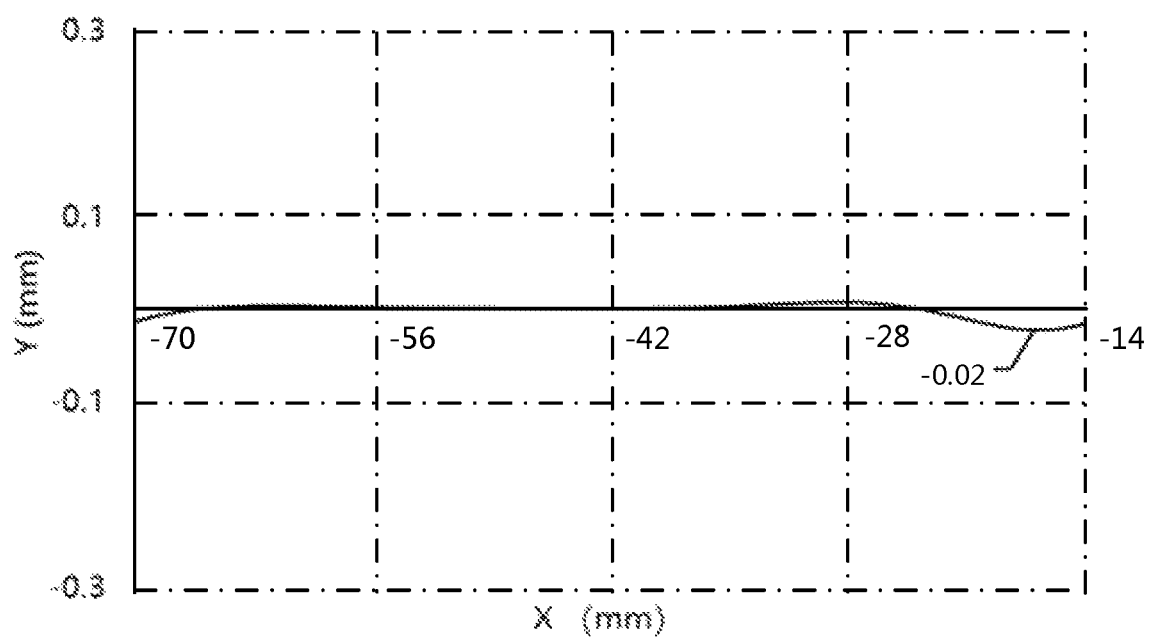
FIG. 8 is a curve graph of wrinkles produced in the third protrusion region of the cover plate after the foldable display module of FIG. 4 is folded.

In order to verify effectiveness that the reinforcement strip 70 disposed on the cover plate according to the embodiment of the present disclosure can reduce the wrinkles formed at an edge of the cover plate 10, a mechanical simulation comparative test was carried out. As shown in FIGS. 7 and 8, FIG. 7 is a curve graph of the wrinkles formed at the third protrusion region 23 of the cover plate 10 after the foldable display module of FIG. 2 (the cover plate 10 is not provided with a reinforcement strip) is folded, and FIG. 8 is a curve graph of the wrinkles formed at the third protrusion region 23 of the cover plate 10 after the foldable display module of FIG. 4 (the cover plate 10 is provided with reinforcement strips) is folded. In the curve graphs of FIG. 7 and FIG. 8, an X-axis represents distances between different positions in the third protrusion region 23 of the cover plate 10 and the bending axis 501 (for example, −14 mm represents a distance between the bending axis 501 and the end of the third protrusion region 23 close to the first region 110), and a Y-axis represents an amplitude of a wrinkle. As can be seen from FIG. 7, after the foldable display module is folded, wrinkles are formed at a plurality of positions in the first direction in the third protrusion region 23 of the cover plate 10, and the closer the third protrusion region 23 is to the first region 110, the more winkles are formed and the amplitudes of the wrinkles are larger, wherein a maximum amplitude of the wrinkles is 0.15 mm. As can be seen from FIG. 8, after the foldable display module is folded, the number and amplitude of the wrinkles formed in the entire region of the third protrusion region 23 of the cover plate 10 are significantly reduced and decreased, and the maximum amplitude of the wrinkles is reduced to 0.02 mm. By comparison, it can be seen that in the embodiment of the present disclosure, disposing the reinforcement strip 70 in the portion of the second region 120 of the cover plate 10 close to the first side edge 101 or/and the second side edge 102 can effectively reduce the wrinkles formed in the portion of the cover plate 10 close to the first side edge 101 or/and the second side edge 102, and reduce the amplitudes of the wrinkles.

In some exemplary embodiments, the first side edge and the second side edge of the first region may be flush with the first edge and the second edge of the flexible display substrate, respectively. In this way, after the foldable display module is folded, wrinkles will not be easily formed in the portion of the second region of the cover plate close to the first side edge or/and the second side edge or the amplitudes of the formed wrinkles can be decreased.

In some exemplary embodiments, the flexible display substrate may include a flexible substrate, and a drive structure layer, a light emitting structure layer, and an encapsulation structure layer that are sequentially stacked on the flexible substrate. The drive structure layer includes a pixel drive circuit. The pixel drive circuit includes a thin film transistor. The light emitting structure layer includes a plurality of light emitting elements, which may be organic electroluminescent diode (OLED) devices, an anode of the light emitting element is connected with a drain electrode of the thin film transistor, and each pixel drive circuit drives a corresponding light emitting element to emit light. The encapsulation structure layer may include a first inorganic encapsulation layer, an organic encapsulation layer and a second inorganic encapsulation layer which are stacked in sequence, and the encapsulation structure layer functions in isolating water and oxygen, thereby improving the service life of the light emitting element. The flexible display substrate may further include a touch-control structure layer disposed at a side of the encapsulation structure layer facing away from the flexible substrate.

An embodiment of the present disclosure further provides a display device which includes the foldable display module described in any of the aforementioned embodiments. The display apparatus may be any product or component with a display function, such as a mobile phone, a tablet computer, a television, a display, a laptop computer, a digital photo frame, or a navigator.

In the accompanying drawings, a size of a constituent element, and a thickness of a layer or a region are sometimes exaggerated for clarity. Therefore, one implementation of the present disclosure is not necessarily limited to the size, and the shape and size of each component in the drawings do not reflect an actual scale. In addition, the drawings schematically illustrate some examples, and one implementation of the present disclosure is not limited to the shapes or numerical values shown in the drawings.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or internal communication between two components. For those ordinarily skilled in the art, meanings of the above terms in the embodiments of the present disclosure can be understood according to situations.

The invention claimed is:

1. A cover plate for a foldable display module, wherein the cover plate is disposed at a display side of a flexible display substrate of the foldable display module, the foldable display module comprises a bending region through which the foldable display module is folded and unfolded;

the cover plate comprises a first region configured to be corresponding to a position of the bending region and second regions positioned at two sides of the first region, and the cover plate further comprises a first surface configured to face the flexible display substrate; and the cover plate comprises a first side edge and a second side edge parallel to a first direction, wherein the first direction is a direction perpendicular to a bending axis of the foldable display module, and a portion of the second region close to the first side edge or/and the second side edge is provided with a reinforcement strip, and the reinforcement strip is disposed on the first surface of the cover plate.

2. The cover plate for the foldable display module according to claim 1, wherein the reinforcement strip extends along the first direction.

3. The cover plate for the foldable display module according to claim 1, wherein a cross-sectional shape of the reinforcement strip is rectangular, trapezoidal, triangular or semicircular.

4. The cover plate for the foldable display module according to claim 2, wherein a portion of the second region close to the first side edge or the second side edge is provided with a plurality of reinforcement strips, and the plurality of reinforcement strips are arranged side by side in a direction parallel to the bending axis of the foldable display module.

5. The cover plate for the foldable display module according to claim 2, wherein a surface of the reinforcement strip facing away from the cover plate is provided with at least one groove, and the at least one groove extends along the first direction.

6. The cover plate for the foldable display module according to claim 5, wherein a cross-sectional shape of the at least one groove is rectangular, trapezoidal, triangular or semi-circular.

7. The cover plate for the foldable display module according to claim 1, wherein an elastic modulus of the reinforcement strip is 4 GPa to 8 GPa.

8. The cover plate for the foldable display module according to claim 1, wherein the reinforcement strip is made of polyethylene terephthalate, acrylic or polyimide; or, the reinforcement strip is formed after a glue is cured.

9. The cover plate for the foldable display module according to claim 1, the cover plate has a thickness of 50 µm to 100 µm and the reinforcement strip has a thickness of 100 µm to 200 µm.

10. The cover plate for the foldable display module according to claim 1, further comprising a third side edge and a fourth side edge opposite to each other, the third edge and the fourth side edge are both parallel to the bending axis; four corner positions of the cover plate and portions of the cover plate close to the third side edge and the fourth side edge are not provided with the reinforcement strip.

11. A foldable display module, comprising a flexible display substrate and the cover plate for the foldable display module according to claim 1, wherein the cover plate is disposed at the display side of the flexible display substrate, the foldable display module comprises a bending region through which the foldable display module is folded and unfolded;

the flexible display substrate comprises a first edge and a second edge parallel to the first direction, the cover plate comprises a protrusion region protruding from the first edge or/and the second edge of the flexible display substrate, and the reinforcement strip is also disposed in the protrusion region.

12. The foldable display module according to claim 11, further comprising a polarizer disposed between the cover plate and the flexible display substrate, and a support layer disposed at a side of the flexible display substrate facing away from the cover plate; and the cover plate also protrudes from the polarizer and the support layer in a direction parallel to the bending axis of the foldable display module.

13. The foldable display module according to claim 11, wherein the first side edge and the second side edge of the first region are flush with the first edge and the second edge of the flexible display substrate, respectively.

14. A display device, comprising the foldable display module according to claim 11.

* * * * *

UNITED STATES PATENT AND TRADEMARK OFFICE
CERTIFICATE OF CORRECTION

PATENT NO. : 12,167,558 B2
APPLICATION NO. : 17/909763
DATED : December 10, 2024
INVENTOR(S) : Biao Gao and Zhao Li Page 1 of 1

It is certified that error appears in the above-identified patent and that said Letters Patent is hereby corrected as shown below:

On the Title Page

Column 1, The 371 (c) Date should be September 07, 2022.

Signed and Sealed this
Twenty-first Day of January, 2025

Coke Morgan Stewart
*Acting Director of the United States Patent and Trademark Office*